United States Patent
Suzuki et al.

(10) Patent No.: US 6,418,027 B1
(45) Date of Patent: Jul. 9, 2002

(54) PROGRAMMABLE LOGIC CONTROLLER MODULE ASSEMBLY AND LOCKING SYSTEM

(75) Inventors: Takao Suzuki, Anjyo; Yasuyuki Nakanishi, Nagoya, both of (JP); Michael S. Baran, Elm Grove, WI (US); Dennis G. Schneider; Anthony G. Gibart, both of New Berlin, WI (US); Joel C. Clemente, Mequon, WI (US); Kevin G. Hughes, Whitefish Bay, WI (US); Paul J. Grosskreuz, West Bend, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/410,214

(22) Filed: Sep. 30, 1999

Related U.S. Application Data

(63) Continuation of application No. 09/193,650, filed on Nov. 17, 1998, now Pat. No. 6,172,875.

(51) Int. Cl.[7] .................................................. G06F 1/16
(52) U.S. Cl. ..................... 361/729; 361/686; 361/731; 361/732; 361/733; 361/735; 361/752; 439/716; 439/717; 439/928; 439/928.1; 439/310
(58) Field of Search .................................. 361/684, 686, 361/725–727, 729–733, 735, 740, 741, 752, 788; 439/310, 532, 716, 717, 928, 928.1; 710/101–104, 300–304; 700/11, 19, 20, 24, 25, 86

(56) References Cited

U.S. PATENT DOCUMENTS

| | | | | |
|---|---|---|---|---|
| 4,152,750 A | * | 5/1979 | Bremenour et al. | 361/729 |
| 4,171,861 A | * | 10/1979 | Hohorst | 439/716 |
| 4,558,914 A | * | 12/1985 | Prager et al. | 361/729 |
| 5,249,979 A | * | 10/1993 | Deinhardt et al. | 439/716 |
| 5,493,194 A | * | 2/1996 | Damiano et al. | 361/733 |
| 5,541,810 A | * | 7/1996 | Donhauser et al. | 361/731 |
| 5,716,241 A | * | 2/1998 | Hennemann et al. | 439/716 |
| 5,737,189 A | * | 4/1998 | Kammersgard et al. | 361/726 |
| 5,786,987 A | * | 7/1998 | Barbier et al. | 361/732 |
| 6,008,985 A | * | 12/1999 | Lake et al. | 361/686 |
| 6,038,130 A | * | 3/2000 | Boeck et al. | 361/735 |
| 6,098,127 A | * | 8/2000 | Kwang | 361/686 |
| 6,122,161 A | * | 9/2000 | Gierut | 361/788 |
| 6,137,686 A | * | 10/2000 | Saye | 361/732 |
| 6,147,877 A | * | 11/2000 | Strandberg et al. | 361/686 |

* cited by examiner

*Primary Examiner*—David L. Talbott
*Assistant Examiner*—John B. Vigushin
(74) *Attorney, Agent, or Firm*—Robert A. Van Someren; Alexander M. Gerasimow; William R. Walbrun

(57) ABSTRACT

A system of interlocking modules for use with a programmable logic controller. The system utilizes a plurality of modules, e.g. input/output modules, that are mechanically and electrically interlinked. Modules are electrically connected to adjacent modules by plug portions The mechanical interlocking features and the plug portions are designed to permit insertion and removal of individual modules disposed between adjacent modules, without moving either of the adjacent modules. Also, the plug portions are designed to isolate the electrical connections from vibration.

21 Claims, 10 Drawing Sheets

PROGRAMMABLE LOGIC CONTROLLER MODULE ASSEMBLY AND LOCKING SYSTEM

CROSS REFERENCE TO RELATED APPLICATIONS

This is a continuation of Ser. No. 09/193,650, filed Nov. 17, 1998, now U.S. Pat. No. 6,172,875 B1, and entitled Programmable Logic Controller Module Assembly and Locking System.

FIELD OF THE INVENTION

The present invention relates generally to controller assemblies, such as those used in a programmable logic controller (PLC) system, and particularly to a floating connector system that facilitates attachment and detachment of individual modules, such as I/O modules, processor modules, communication modules and power supplies.

BACKGROUND OF THE INVENTION

Programmable logic controllers are used throughout industry to control and monitor a wide range of machines and other movable components and systems. Conventional PLC systems utilize a plurality of modules, e.g. input/output modules, that are mechanically mounted in a rack system and electronically connected along a back plane. The individual modules can be interchanged or replaced by disconnecting them from the rack and/or back plane. It would be advantageous to eliminate the mounting components, e.g. rack and back plane, and to provide modules that were in an interlocking, modular form.

At least one attempt has been made to construct modules that may be interconnected to each other without the use of a rack or back plane. In this particular embodiment, each module includes a stationary plug and a stationary plug receptacle designed for mating engagement with the stationary plug of a next adjacent module. Additionally, each module includes a housing having a plurality of tongs on one side and a plurality of openings on the opposite side to receive the extended tongs of the next adjacent module. Each module also includes a mounting mechanism for mounting along a DIN rail.

Thus, an individual module can be attached to an adjacent module by moving the individual module along the DIN rail until the tongs and plug connector engage the openings and plug connector of the next adjacent module. Once engaged, locking mechanisms are used to hold the module prongs within the corresponding openings of the next adjacent module.

This configuration does not permit mechanical interlocking of adjacent modules independent of forming an electrical connection between modules. Additionally, the design does not permit the removal of an individual module that is sandwiched between adjacent modules without upsetting the mounting of additional I/O modules. The mechanical interlocking system requires that a module be moved laterally sufficiently far to clear its engagement prongs from the openings of the next adjacent module. To permit this lateral movement, all of the modules positioned on one side of the subject module must be moved to provide sufficient clearance for removal and/or insertion of the subject module. Once the subject module is engaged, the string of modules moved out of the way must be reengaged.

Existing modules can also suffer from vibration that commonly exists in industrial environments. Typically, one module is electrically connected to another module by mating male and female plugs. This relatively rigid connection can induce vibration from one plug connector to the next as the modules are exposed to vibrational forces in an industrial environment. Over time, this can lead to fatigue and failure of the electrical connections.

It would be advantageous to have a compact, rackless, modular PLC system utilizing modules that could be selectively, mechanically interlocked and yet readily inserted or removed regardless of whether the module was disposed between adjacent modules. It would also be advantageous to protect the electrical coupling of adjacent modules from detrimental effects of vibration.

SUMMARY OF THE INVENTION

The present invention features a programmable logic controller system. The system comprises first module having a first electrical plug connected thereto. The system also includes a second module that may be mounted adjacent the first module. The second module includes a second electrical plug connected thereto and configured to matingly receive the first electrical plug. At least one of the first and second electrical plugs is connected to its corresponding first or second module by a floating connection.

According to another aspect of the invention, a control system module is provided. The module is configured for mounting along a common mounting structure adjacent other control system modules. The system includes a housing having a back portion, a front portion, a left side and a right side. The system also includes at least one printed circuit board mounted at least partially within the housing. An attachment mechanism is configured to mount the housing to the common mounting structure, such that the back portion lies adjacent the mounting structure. Additionally, a plurality of interconnection features are arranged to permit sliding engagement of the module with a pair of adjacent PLC modules that are connected to the same mounting structure. Each module includes a pair of plug portions that are electrically coupled to the at least one printed circuit board. The plug portions are configured for engagement with a corresponding plug portion of an adjacent module. At least one of each pair of plug portions is connected to the printed circuit board by a floating connection to protect the various electrical couplings from vibration.

According to another aspect of the present invention, a method is provided for electrically connecting a plurality of modules in a PLC system while protecting the electrical connection from vibration. The method includes aligning a first module with a second module. The method further includes affixing a first electrical plug portion to the first module, and connecting a second electrical plug portion to the second module by a flexible connector. Further, the method includes moving the second electrical plug portion into engagement with the first electrical plug portion, while the first module remains generally fixed with respect to the second module.

BRIEF DESCRIPTION OF THE DRAWINGS

The invention will hereafter be described with reference to the accompanying drawings, wherein like reference numerals denote like elements, and.

DETAILED DESCRIPTION OF THE PREFERRED EMBODIMENTS

Figure 1:
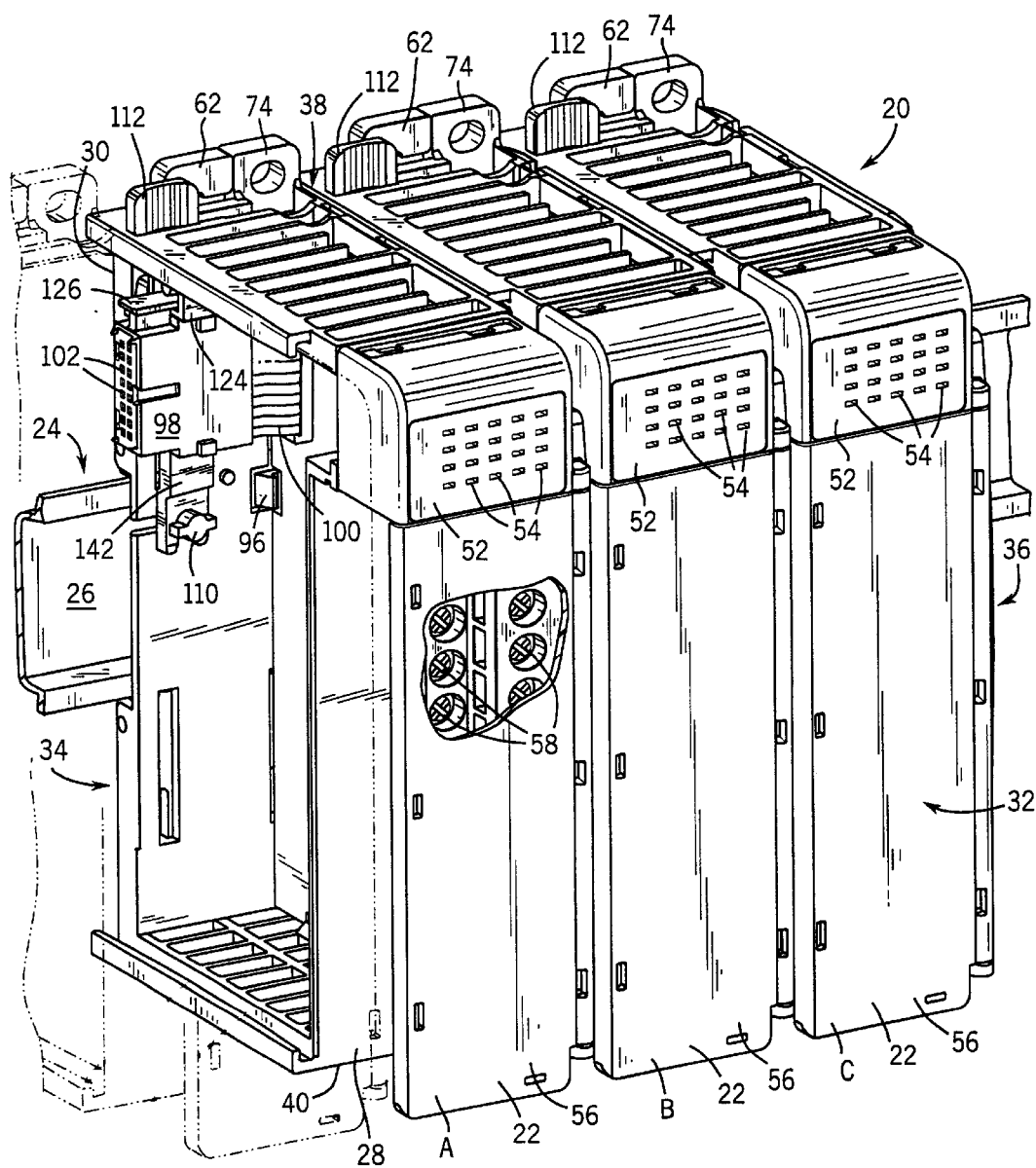
FIG. 1 is a perspective view of a system of PLC system modules, according to a preferred embodiment of the present invention.
Figure 2:
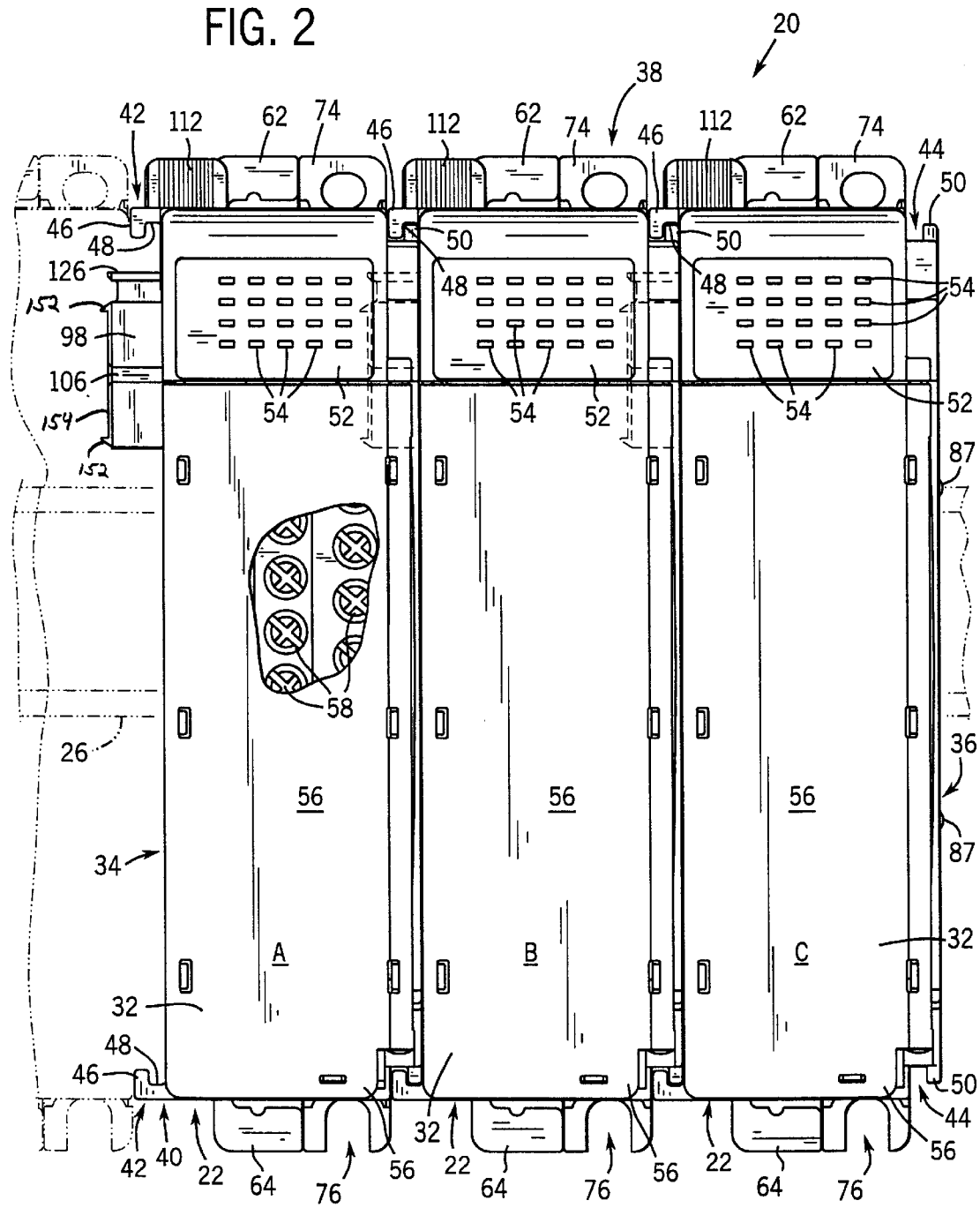
FIG. 2 is a front view of the modules illustrated in FIG. 1.

Referring generally to FIGS. 1 and 2, a system 20 of interlocking modules 22 is illustrated, according to a preferred embodiment of the present invention. Interlocking modules 22 are, by way of example, input/output modules, processor modules, communication modules and power supplies, of the type used with a PLC system. Modules 22 may be mounted along a mounting structure 24, such as a DIN rail 26 or planar surface.

In the embodiment illustrated, three modules 22 have been illustrated as mounted along DIN rail 26. The selection of three modules is for the purpose of enhancing explanation. The illustration and discussion of three interlocking modules 22 should not, in any way, be limiting. For example, fewer modules or many additional modules can be incorporated into system 20 without departing from the scope of the invention. Additionally, the modules are typically connected to a controller, such as a programmable logic controller.

Each module 22 includes an outer module case or housing 28 having a back portion 30 (see FIG. 1), a front portion 32, a left side 34 and a right side 36. Additionally, each module 22 includes a top 38 and a bottom 40. The reference to left, right, top, bottom, back and front are based on the orientation of system 20 in FIG. 1. However, those terms are used to facilitate explanation and should not be construed as limiting the orientation of interlocking modules 22.

In the preferred embodiment, each module 22 includes interlocking features for selective connection to adjacent modules without the use of a rack or back plane. Specifically, each module includes a first interconnection feature 42 and a second interconnection feature 44. In the most preferred embodiment, first interconnection feature 42 comprises an extension 46 having a groove 48. Second interconnection feature 44, on the other hand, comprises a protrusion or tongue 50 designed to matingly engage groove 48. As illustrated, an extension 46 and corresponding groove 48 may be disposed along the left side of housing 28 proximate top 38 and bottom 40. A tongue 50, on the other hand, may be disposed along the right side of housing 28 proximate top 38 and bottom 40. The alternating tongues and grooves of adjacent modules 22 permit the interconnection of multiple modules.

For example, the illustrated modules 22 can be labeled A, B and C, with module A being left most, module B being central, and module C being right most. In this particular example, central module B is connected with the next adjacent module to its left, A, when the tongue 50 of module A is slidingly engaged with the groove 48 of module B. Similarly, the next adjacent module to the right of module B, labeled as module C, can be joined by sliding groove 48 of module C along tongue 50 of module B. These mechanically interlinked modules 22 can be mounted along mounting structure 24, e.g. DIN rail 26.

Preferably, the interconnection features, such as grooves 48 and tongues 50 are oriented in a direction generally transverse to the plane in which mounting structure 24 lies. Thus, a centrally located module, such as module B can be released from mounting structure 24 and removed from the adjacent modules A and C by sliding the module away from mounting structure 24 until its interconnection features 42 and 44 clear the adjacent modules. This eliminates the need to remove additional modules when removing or replacing a centrally located module.

Additional features of each module can now be described. As illustrated in FIG. 2, front portion 32 includes indicator 52 that may comprise a plurality of LEDs 54. Additionally, a removable cover 56 is disposed over a plurality of input/output terminals 58 as illustrated in the partially broken away section of FIG. 2.

Figure 3:
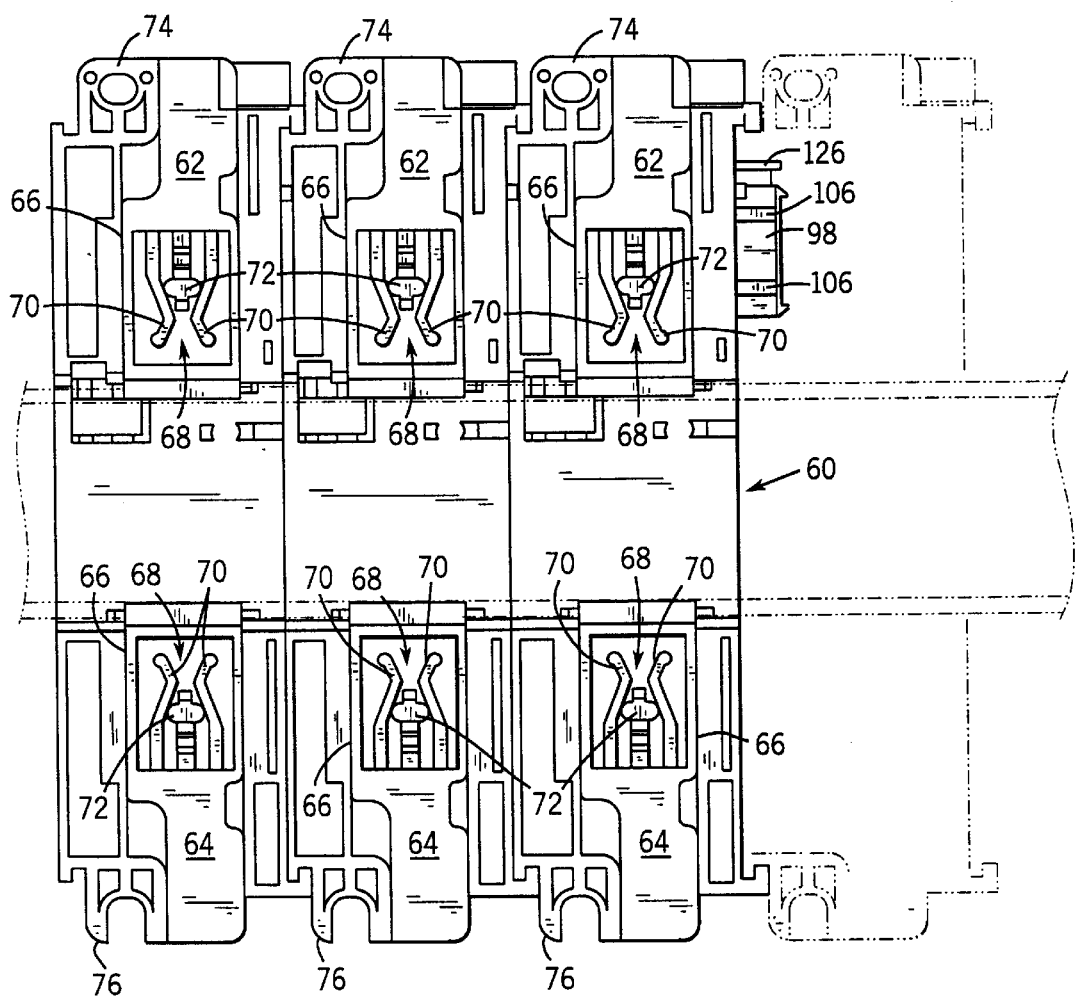
FIG. 3 is a rear view of the modules illustrated in FIG. 1.

Back portion 30 is illustrated best in FIG. 3. Back portion 30 includes a DIN rail mounting area 60 for receiving a DIN rail. Additionally, an upper DIN latch 62 and a lower DIN latch 64 are slidably mounted in slides 66. Upper DIN latch 62 and lower DIN latch 64 each have a biasing mechanism 68 that biases the latch to an open or a closed position. Specifically, each biasing mechanism 68 includes a pair of resilient prongs 70 that slide past a stationary abutment 72 as the latch moves along it corresponding slide 66. The resilient prongs 70 are shaped to require a certain amount of force to bias the latch from an open to a closed position and vice versa.

Additionally, each module 22 preferably includes an upper mounting foot 74 and a lower mounting foot 76. Mounting feet 74 and 76 may be used to mount each module 22 to a panel, typically a planar panel used in lieu of DIN rail 26.

Figure 4:
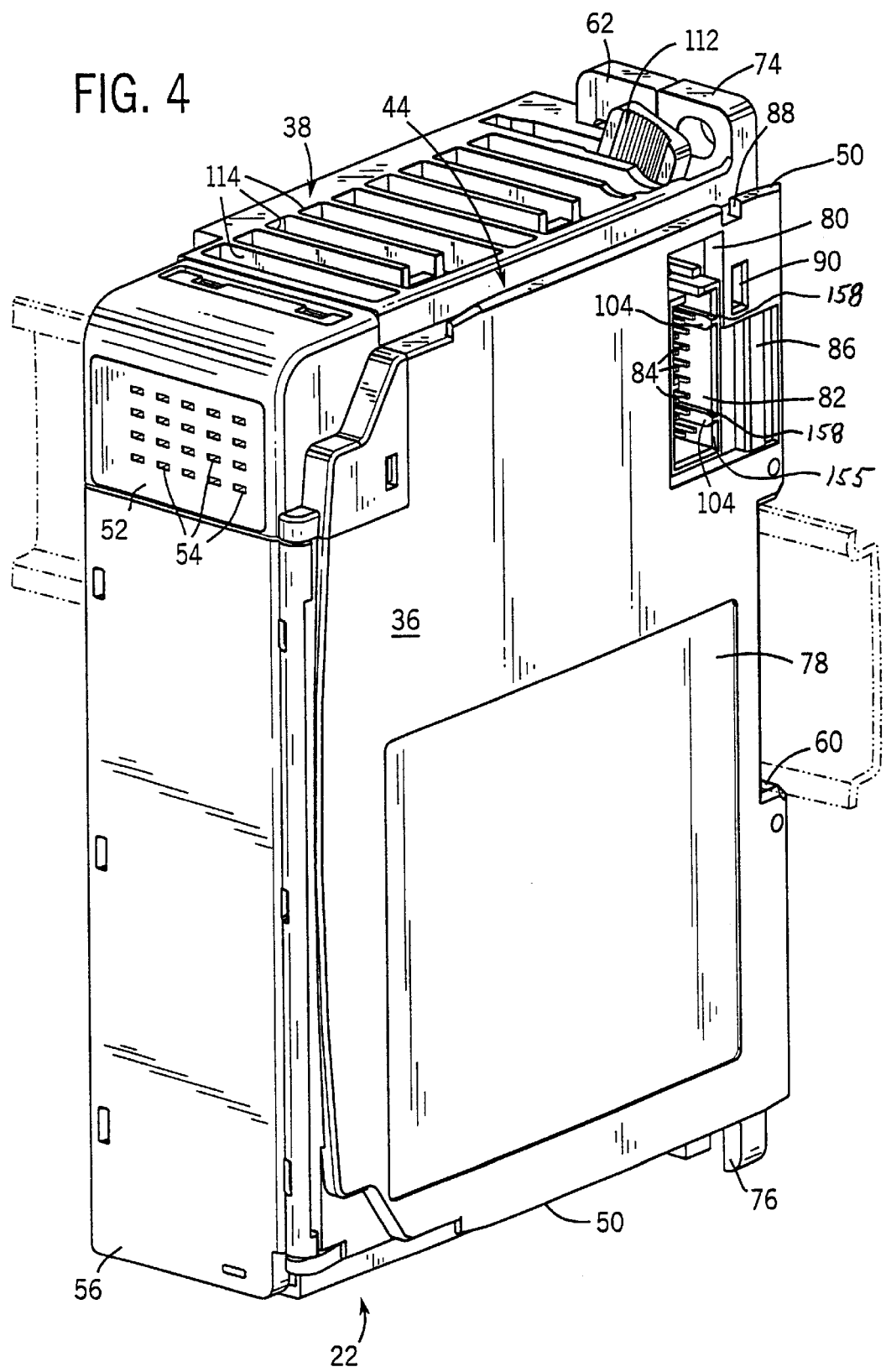
FIG. 4 is a perspective view of an individual module of the type illustrated in FIG. 1, taken generally from the right side.
Figure 5:
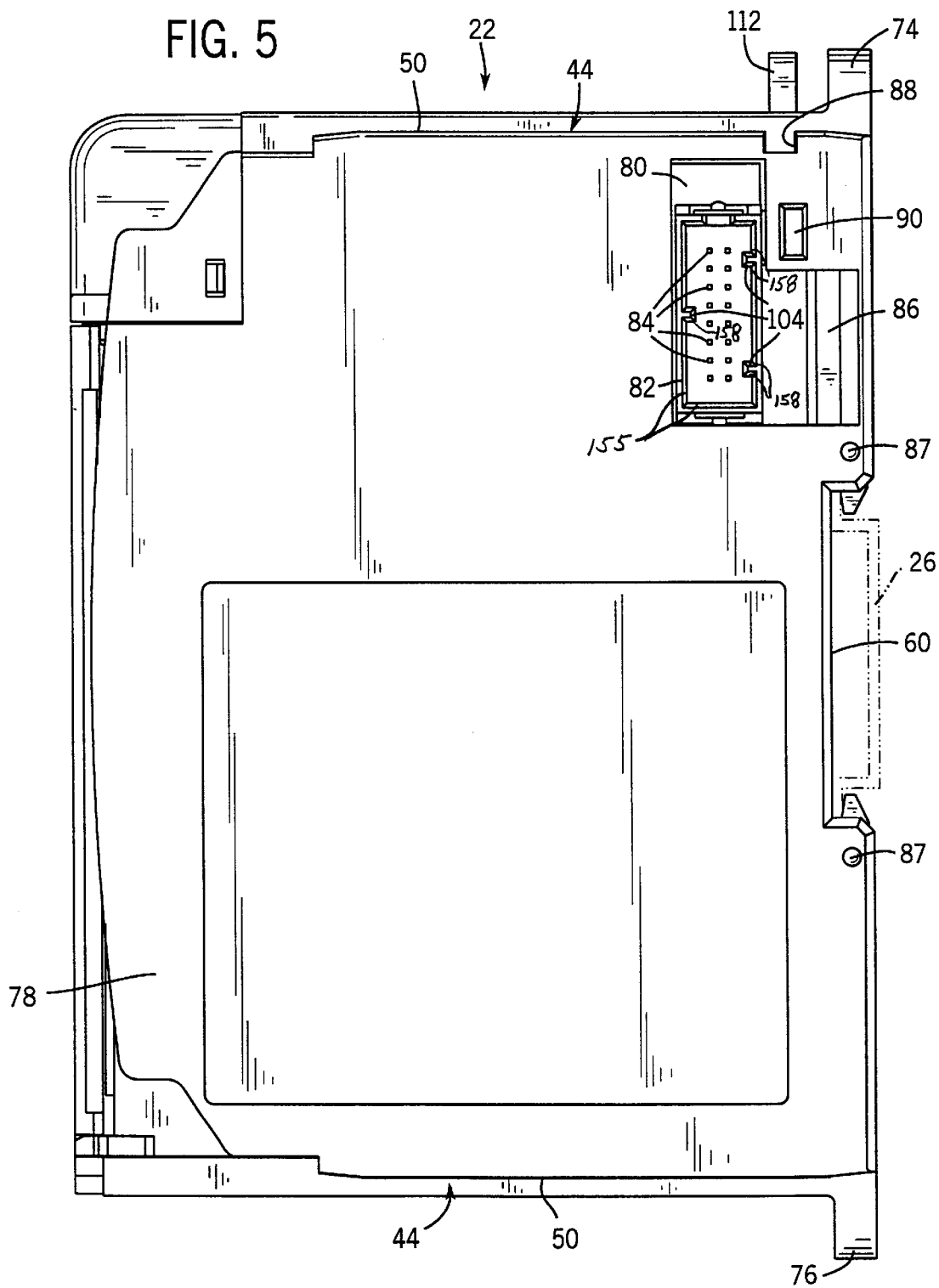
FIG. 5 is a right side view of the module of FIG. 4.

As illustrated in FIGS. 4 and 5, the right side of each module 22 preferably includes a side wall 78. Side wall 78 includes an opening 80 through which a connector plug portion 82 is exposed. Connector plug portion 82 is designed for mating engagement with a corresponding plug portion of the next adjacent module 22 to form an electrical interconnection between adjacent modules, as described more fully below. Connection plug portion 82 may, for instance, be in the form of a plug receptacle having a plurality of conductors 84. Also disposed within opening 80 is a ground contact 86 that meets with corresponding ground contacts in adjacent modules. A locator 87, such as rounded male protrusions, can be disposed along side wall 78, as illustrated. Locators 87 help position adjacent modules 22 to facilitate electrical and mechanical interconnection.

Furthermore, a locking notch 88 is formed in tongue 50 to aid in the mechanical interconnection of adjacent modules once those modules are electrically interconnected. A lever lock recess 90 also may be formed in side wall 78 to further interlock adjacent modules once mechanical and electrical interconnection has been formed.

Figure 6:
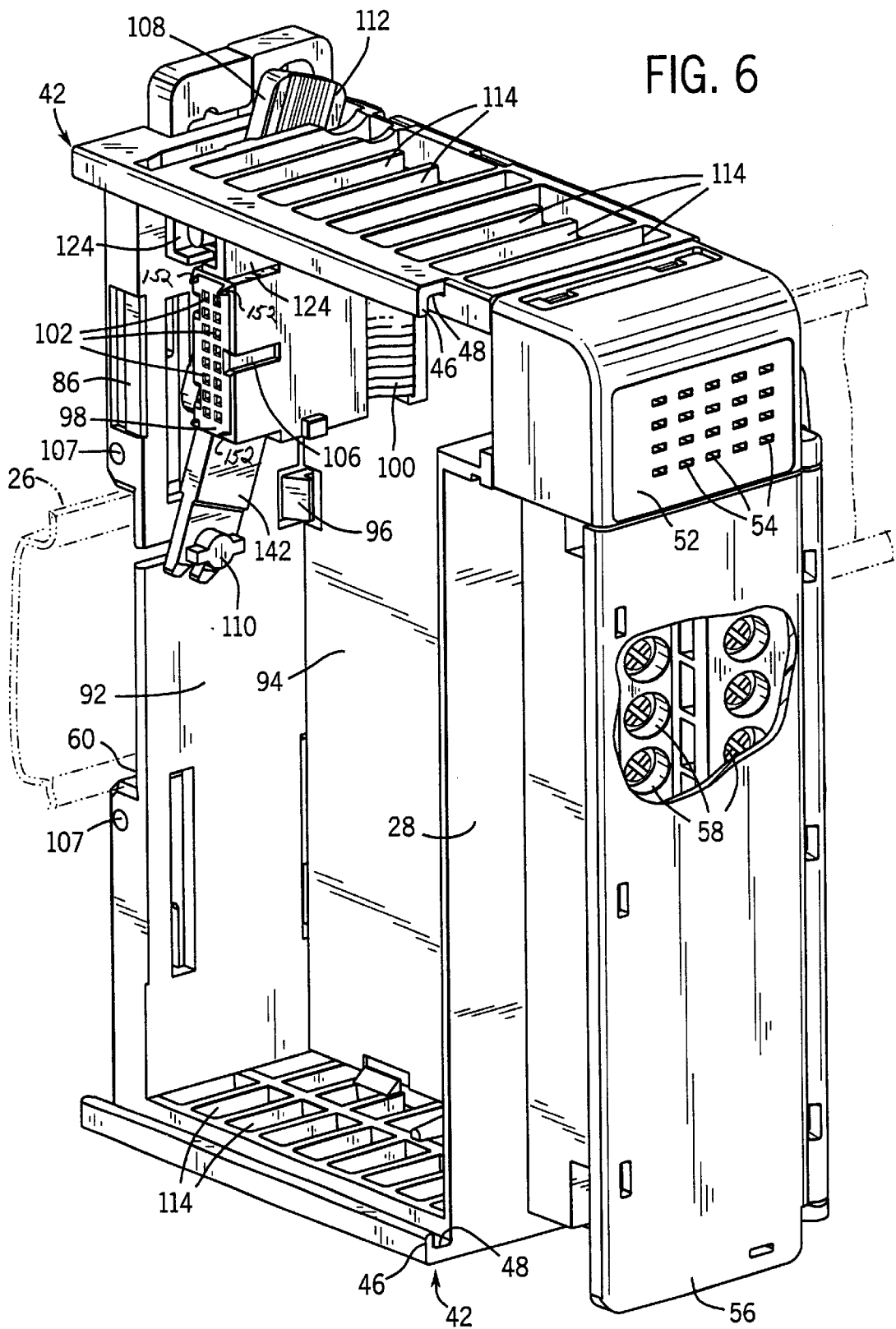
FIG. 6 is a perspective view of the module of FIG. 4, taken generally from the left side.
Figure 7:
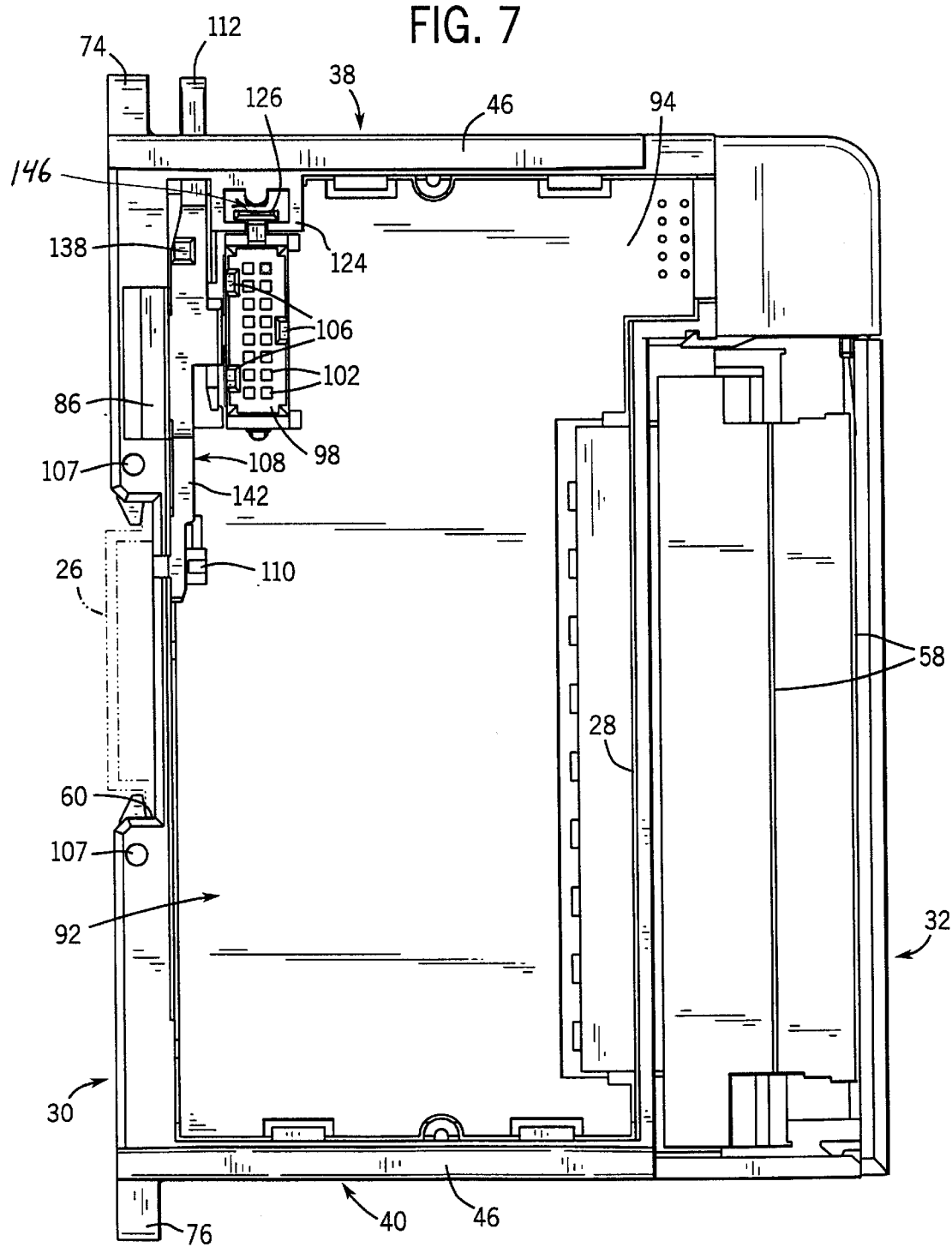
FIG. 7 is a left side view of the module of FIG. 4.

As illustrated in FIGS. 6 and 7, the left side 34 of each module 22 typically exposes a generally open interior 92 in which a printed circuit board 94 is mounted, for instance, by a latch mechanism 96. Additionally, a mating connector plug portion 98 is electrically coupled with circuit board 94 by a flexible connector 100, such as a flexible ribbon cable.

Mating connector plug portion 98 may be a male plug connector designed for mating engagement with plug portion 82. Mating plug portion 98 may include, for instance, a plurality of receptacles 102 arranged to receive conductors 84 of plug portion 82 to form electrical interconnection for proper transfer of signals from one module to another. To ensure proper mating of plug portions 82 and 98, a plurality of mating ridges 104 (see FIG. 4) and grooves 106 (see FIG. 6) may be formed in plug portions 82 and 98, respectively. Preferably, a pair of locator recesses 107 are positioned to receive male locators 87 and to facilitate alignment of adjacent modules as well as plug portions 82 and 98.

At least one of connector plug portion 82 and mating connector plug portion 98 is movable to permit selective engagement with the corresponding plug portion of the next adjacent module 22. Preferably, the movable plug portion is movable in a direction generally transverse to the direction in which adjacent modules 22 are slidingly engaged via mating grooves 48 and tongues 50. In other words, the movable plug portion preferably moves in a direction generally parallel to mounting structure 24.

In the illustrated embodiment, the male plug portion 98 is mounted for movement, and connector plug portion 82 is mounted in a stationary position. Thus, male plug portion 98 is connected to printed circuit board 94 via ribbon cable 100, and female plug portion 82 is affixed to stationary PC board 94, generally on an opposite side thereof. When adjacent modules 22 are mechanically interlinked, the male plug portion 98 of one module may be moved into mating engagement with the female plug portion 82 of the module to its left. Similarly, the female plug portion 82 may be engaged by the male plug portion 98 of the next adjacent module 22 disposed to its right. Thus, an electrical interconnection and mechanical interconnection can be formed independently between adjacent modules, e.g. input/output modules. Also, the electrical interconnection can be disengaged independently of the mechanical interconnection. Furthermore, upon mechanical release and electrical release (see description below), an individual module 22 may be released from mounting structure 24 and removed without moving the modules adjacent its left and right.

Figure 8:
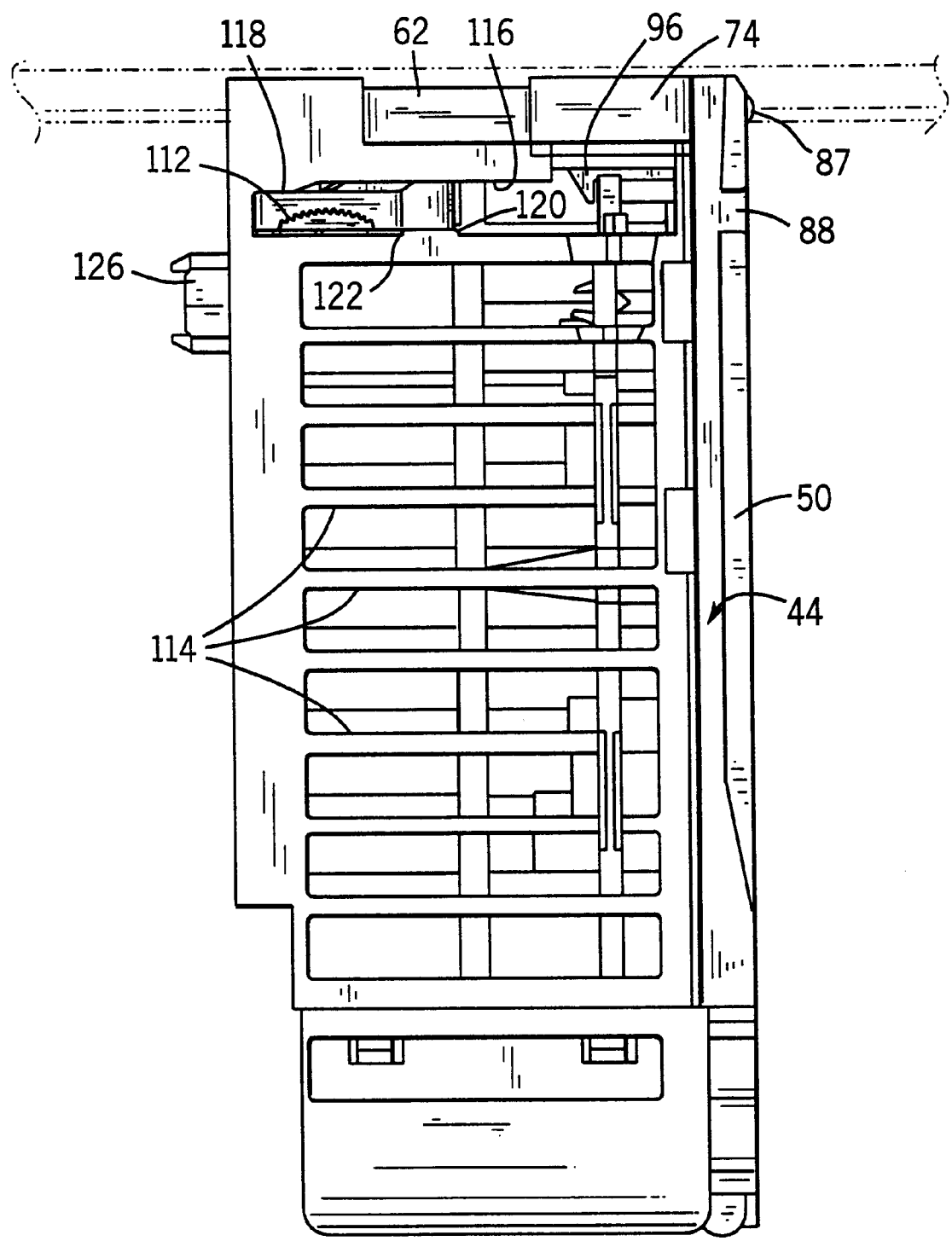
FIG. 8 is a top view of the module of FIG. 4.

A preferred mechanism for moving plug portion 98 into and out of engagement with a corresponding plug portion 82 is a pivotable lever 108. Pivotable lever 108 is mounted to a pivot pin 110 extending into open interior 92 from back portion 30. Pivotable lever 108 includes a handle portion 112 that extends through top 38, as best illustrated in FIG. 8.

Both top 38 and bottom 40 include a plurality of ventilation slots 114, but top 38 also includes a lever slot 116. Lever slot 116 includes a narrowed region 118 that engages handle 112 when plug portion 98 is moved into engagement with plug portion 82 of an adjacent module 22. Additionally, an open stop 120 and a closed stop 122 extend into lever slot 116. Open stop 120 maintains lever 108 in an open or disengaged position, and closed stop 122 maintains lever 108 in a closed or engaged position when plug portion 98 is moved into engagement with plug portion 82. The closed stop 122 aids in maintaining the lever 108 in an engaged or closed position even in industrial environments with substantial vibration.

As best illustrated in FIG. 7, plug portion 98 is mounted to pivotable lever 108 between pivot pin 110 and handle portion 112. Preferably, a plug guide 124 extends from top 38 into open interior 92. Plug portion 98 includes a corresponding plug rail 126 that is held within plug guide 124 for reciprocal motion along a single axis of movement.

Furthermore, plug portion 98 is pivotably and slidably mounted to lever 108 to permit linear movement of plug portion 98 along plug guide 124 during engagement and disengagement. This type of mounting ensures that plug portion 98 moves in a linear fashion into engagement and out of engagement with a corresponding plug portion 82.

Figure 9:
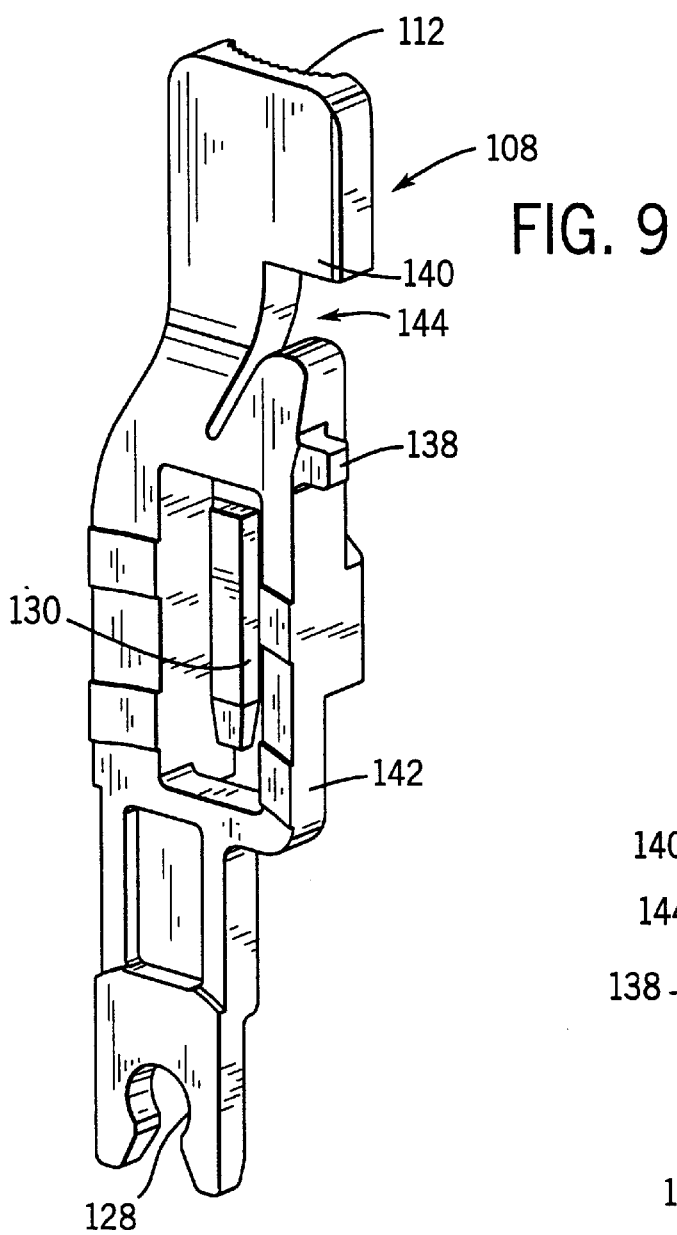
FIG. 9 is a perspective view of an interlocking lever of the module, according to a preferred embodiment of the present invention.
Figure 10:
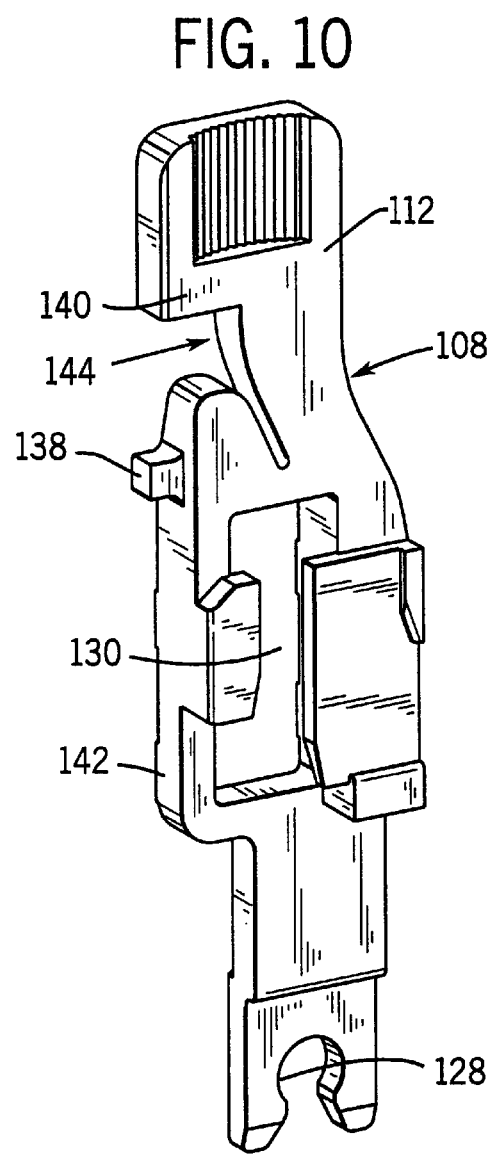
FIG. 10 is another perspective view of the lever of FIG. 9.
Figure 11:
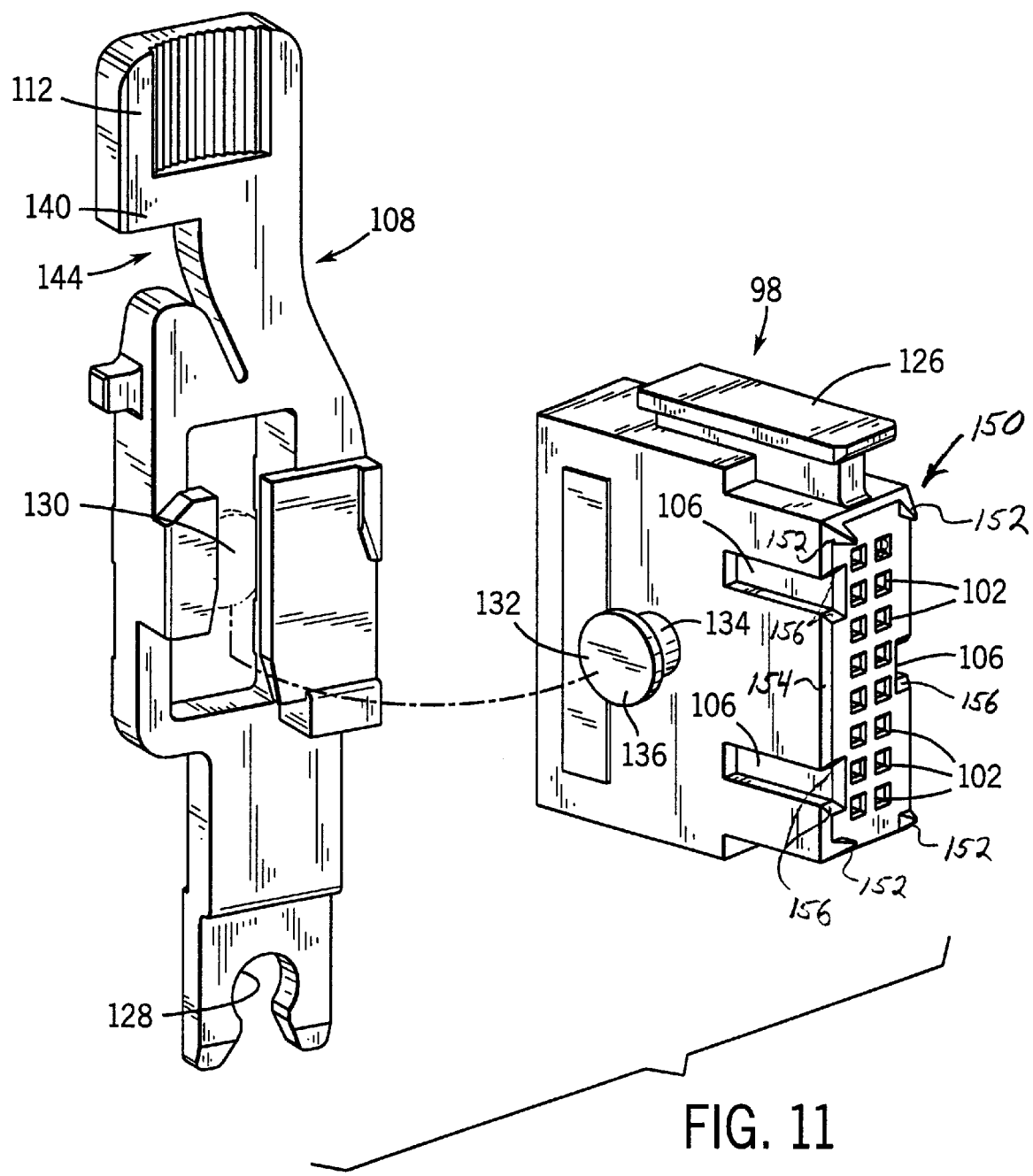
FIG. 11 is a perspective view similar to that of FIG. 10, but showing the plug connector adjacent the lever.

The specific details of pivotable lever 108 and its connection to plug portion 98 may be explained more fully with reference to FIGS. 9–11. As illustrated, lever 108 includes an aperture 128 designed for pivotable engagement with pivot pin 110. Additionally, lever 108 includes a nail head slot 130 designed to receive a plug nail head 132 extending from plug portion 98. Plug nail head 132 includes a neck 134 and an expanded portion 136. When plug portion 98 is connected to lever 108, neck 134 permits both pivotable and sliding motion of plug portion 98 within nail head slot 130. However, the nail head slot 130 is captured between expanded portion 136 and the main body of plug portion 98 to prevent inadvertent detachment. Additionally, the mounting of plug rail 126 in plug guide 124 ensures that plug portion 98 does not slide beyond the reach of nail head slot 130.

Lever 108 also includes a lever case lock protrusion 138 designed for engagement with lever lock recess 90 (see FIGS. 4 and 5) to help prevent movement of adjacent modules 22 once their plug portions 98 and 82 are engaged. Lever 108 also includes a locking ledge 140 disposed for engagement with locking notch 88 of the next adjacent module 22 when adjacent modules are mechanically and electrically interconnected.

Handle portion 112 may be connected to a central body portion 142 by a lever spring 144. Lever spring 144 provides added flexibility in handle portion 112 as it moves around open stop 120 and closed stop 122 to engage narrowed region 118. The lever spring 144 further aids in maintaining lever 108 in a closed position by preventing inadvertent movement past closed stop 122 towards an open position.

In operation, adjacent input/output modules 22 may be mounted along a mounting structure, such as DIN rail 26. The adjacent modules 22 are mechanically interlocked by slidably engaging corresponding tongues 50 with grooves 48. The grooves 48 and tongues 50 are arranged to permit adjacent modules 22 to be slid into engagement in a direction generally transverse to the DIN rail 26. This permits individual modules to be removed when sandwiched between adjacent modules, without removing any adjacent modules.

Furthermore, system 20 permits adjacent modules 22 to be electrically interconnected independent of any mechanical interconnection. Once adjacent modules are mechanically interconnected, the electrical interconnection may be formed simply by pivoting lever 108 and moving male plug portion 98 into engagement with female plug portion 82 of the next adjacent module 22.

Similarly, an individual module 22 may be removed simply by disengaging its male plug portion 98 from the adjacent female plug portion 82. If there are any modules 22 mounted adjacent the right side 36, the lever 108 of that module is moved to release its plug portion 98 from plug portion 82 of the subject module 22. The subject module may then be released from DIN rail 26 by separating its latches 62 and 64. At this point, the subject module 22 is slid away from the DIN rail 26 and mechanically disconnected without moving either of the adjacent modules 22. This ability to quickly and easily remove and replace individual modules without dismantling the system, substantially reduces downtime when servicing and repairing PLC systems utilized in an industrial environment.

Furthermore, it is preferred that the electrical connection system be designed as a floating connector system to minimize detrimental effects of the relatively harsh conditions, such as vibration, that can occur in an industrial environment. This is accomplished by permitting movement of plug portion 98 with respect to its mechanical mounting points, and by connecting plug portion 98 to stationary PC board 94 via flexible ribbon cable 100.

Specifically, plug nail head 132 is allowed to freely pivot and slide along nail head slot 130. Additionally, a relief gap 146 is disposed between plug guide 124 and plug rail 126 of plug portion 98, as illustrated best in FIG. 7. The combination of flexible ribbon cable 100, nail head slot 130 and relief gap 146 permit plug portion 98 to be relatively free-floating, even after engagement with female plug portion 82.

Upon engagement, a given plug portion 98 effectively becomes part of the next adjacent module 22 that carries the female plug portion 82 to which it is engaged. The given plug portion 98 is substantially isolated from shock and vibration incurred by the module 22 to which it is connected via flexible ribbon cable 100. This arrangement of interconnection features permits relative motion between adjacent modules 22 while minimizing fatigue or other damage to the connected components.

To accommodate this preferred, free-floating design, a guidance system 150 is utilized to ensure smooth engagement of plug portion 98 and the corresponding female plug portion 82 when lever 108 is moved to its closed or engaged position. Guidance system 150 may include a variety of features to help move plug portion 98 into full engagement with plug portion 82. For example, preferred features include a plurality of tapered corner pins 152, as illustrated best in FIG. 11, that help guide and align plug 98 as it begins to enter female plug portion 82. In addition, plug portion 98 includes a chamfered leading edge 154 that joins and cooperates with tapered corner pins 152 in guiding plug portion 98 into engagement with female plug portion 82. Female plug portion 82 similarly includes a chamfered receiving edge 155. Guide grooves 106 also include expanded or chamfered lead openings 156 that cooperate with inwardly chamfered ends 158 on mating ridges 104 of plug portion 82 (see FIGS. 4 and 5). All of these guidance system features cooperate to ensure smooth and consistent engagement and disengagement of plug portion 98 with female plug portion 82 while accommodating the free-floating design of the electrical connector system.

It will be understood that the foregoing description is of a preferred exemplary embodiment of this invention, and that the invention is not limited to the specific form shown. For example, the module housings may be made in a variety of configurations and from a variety of materials; the mechanical interlocking features may be integrally molded with the housing or separately attached; a variety of electrical connections can be utilized for connecting adjacent modules; flexible connectors other than ribbon cable can be utilized; and one or both of the plug connectors can be movable to facilitate electrical connection. These and other modifications may be made in the design and arrangement of the elements without departing from the scope of the invention as expressed in the appended claims.

What is claimed is:

1. A programmable logic controller system, comprising:
   a first module having a first electrical plug connected thereto;
   a second module mountable adjacent the first module, the second module including a second electrical plug connected thereto and configured to matingly receive the first electrical plug, wherein at least one of the first electrical plug and the second electrical plug is connected to its corresponding first or second module by a floating connection.

2. The programmable logic controller system as recited in claim 1, wherein the first electrical plug is connected to the first module by the floating connection.

3. The programmable logic controller system as recited in claim 2, wherein the first module includes a first printed circuit board to which the first plug is electrically connected.

4. The programmable logic controller system as recited in claim 3, wherein the second module includes a second printed circuit board to which the second plug is electrically connected.

5. The programmable logic controller system as recited in claim 4, wherein the first electrical plug is electrically connected to the first printed circuit board by a flexible cable.

6. The programmable logic controller system as recited in claim 5, wherein the first electrical plug comprises a guidance system to facilitate engagement with the second electrical plug.

7. The programmable logic controller system as recited in claim 6, wherein the guidance system comprises a chamfered lead edge.

8. The programmable logic controller system as recited in claim 7, wherein the guidance system comprises a plurality of tapered corner pins.

9. A control system module configured for mounting along a common mounting structure adjacent other control system modules, comprising:
   a housing having a back portion, a front portion, a left side and a right side;
   at least one printed circuit board mounted at least partially within the housing;
   an attachment mechanism configured to mount the housing to the common mounting structure, such that the back portion lies adjacent the mounting structure;
   a plurality of interconnection features arranged to permit sliding engagement with a pair of adjacent PLC modules connected to the mounting structure such that a first adjacent PLC module is disposed adjacent the left side and a second adjacent PLC module is disposed adjacent the right side;
   a pair of electrical connectors each electrically coupled to the at least one printed circuit board and configured for engagement with a corresponding electrical connector of an adjacent module, wherein at least one electrical connector is connected to the at least one printed circuit board by a floating connection.

10. The control system module as recited in claim 9, further comprising a lever pivotably mounted to the housing, wherein the at least one electrical connector is mounted to the lever.

11. The control system module as recited in claim 10, wherein the at least one electrical connector is pivotably mounted to the lever.

12. The control system module as recited in claim 11, wherein the at least one electrical connector is slidably mounted to the lever.

13. The control system module as recited in claim 12, wherein the at least one electrical connector is connected to the printed circuit board by a flexible cable.

14. The control system module as recited in claim 13, wherein the flexible cable comprises a ribbon cable.

15. The control system module as recited in claim 9, wherein at least one electrical connector is electrically connected to the first printed circuit board by a flexible cable.

16. The control system module as recited in claim 15, wherein the guidance system comprises a chamfered lead edge.

17. The control system module as recited in claim 16, wherein the guidance system comprises a plurality of tapered corner pins.

18. A method for electrically connecting a plurality of modules in a PLC system while protecting the electrical connection from vibration, comprising:

aligning a first module with a second module;

affixing a first electrical plug portion to the first module;

connecting a second electrical plug portion to the second module by a flexible connector; and moving the second electrical plug portion into engagement with the first electrical plug portion while the first module remains generally fixed with respect to the second module.

19. The method as recited in claim 18, further comprising providing the first and second electrical plug portions with guidance features to facilitate engagement.

20. The method as recited in claim 19, further comprising mounting the second electrical plug portion to a lever pivotably connected to the second module.

21. The method as recited in claim 20, wherein mounting comprises mounting the second electrical plug portion for pivotable motion with respect to the lever.

* * * * *